United States Patent

Delagrange

[15] 3,652,871

[45] Mar. 28, 1972

[54] EXPONENTIAL ATTENUATOR-AMPLIFIER CIRCUIT

[72] Inventor: Arthur D. Delagrange, Sykesville, Md.

[73] Assignee: The United States of America as represented by the Secretary of the Navy

[22] Filed: Jan. 19, 1970

[21] Appl. No.: 3,656

[52] U.S. Cl. ..............................307/230, 307/254, 307/237, 328/145

[51] Int. Cl. ..............................H03k 7/00

[58] Field of Search ..............................307/229, 230, 254; 328/145; 330/30 D

[56] References Cited

UNITED STATES PATENTS

| | | | |
|---|---|---|---|
| 3,090,011 | 5/1963 | Hammer | 328/145 |
| 3,259,761 | 7/1966 | Narud et al. | 330/30 D X |
| 3,348,072 | 10/1967 | Marcus et al. | 307/229 X |
| 3,423,578 | 1/1969 | Platzer, Jr. et al. | 307/229 X |
| 3,448,297 | 6/1969 | Rhodes | 307/229 |
| 3,501,648 | 3/1970 | Welb | 330/30 D X |
| 3,437,843 | 4/1969 | Phillips | 307/254 |
| 3,353,091 | 11/1967 | Matsumoto | 307/230 X |

OTHER PUBLICATIONS

" Using the New Constant-Current Diodes," Electronics World by D. Lancaster Oct. 1967 TK6540 R623 pp. 30, 31.

*Primary Examiner*—Donald D. Forrer
*Assistant Examiner*—B. P. Davis
*Attorney*—R. S. Sciascia and J. A. Cooke

[57] ABSTRACT

An exponential attenuator-amplifier circuit having a pair of transistors coupled back-to-back in a modified common emitter configuration as its principal active components. This arrangement utilizes the logarithmic current-voltage characteristic of the base-emitter diode of one of the transistors so that it operates as a logarithmic voltage amplifier, while a DC voltage applied to the other transistor sets the voltage bias level and controls the voltage gain of the pair. A current source is included in the emitter circuit of the transistor pair to render circuit current independent of bias voltage changes.

3 Claims, 1 Drawing Figure

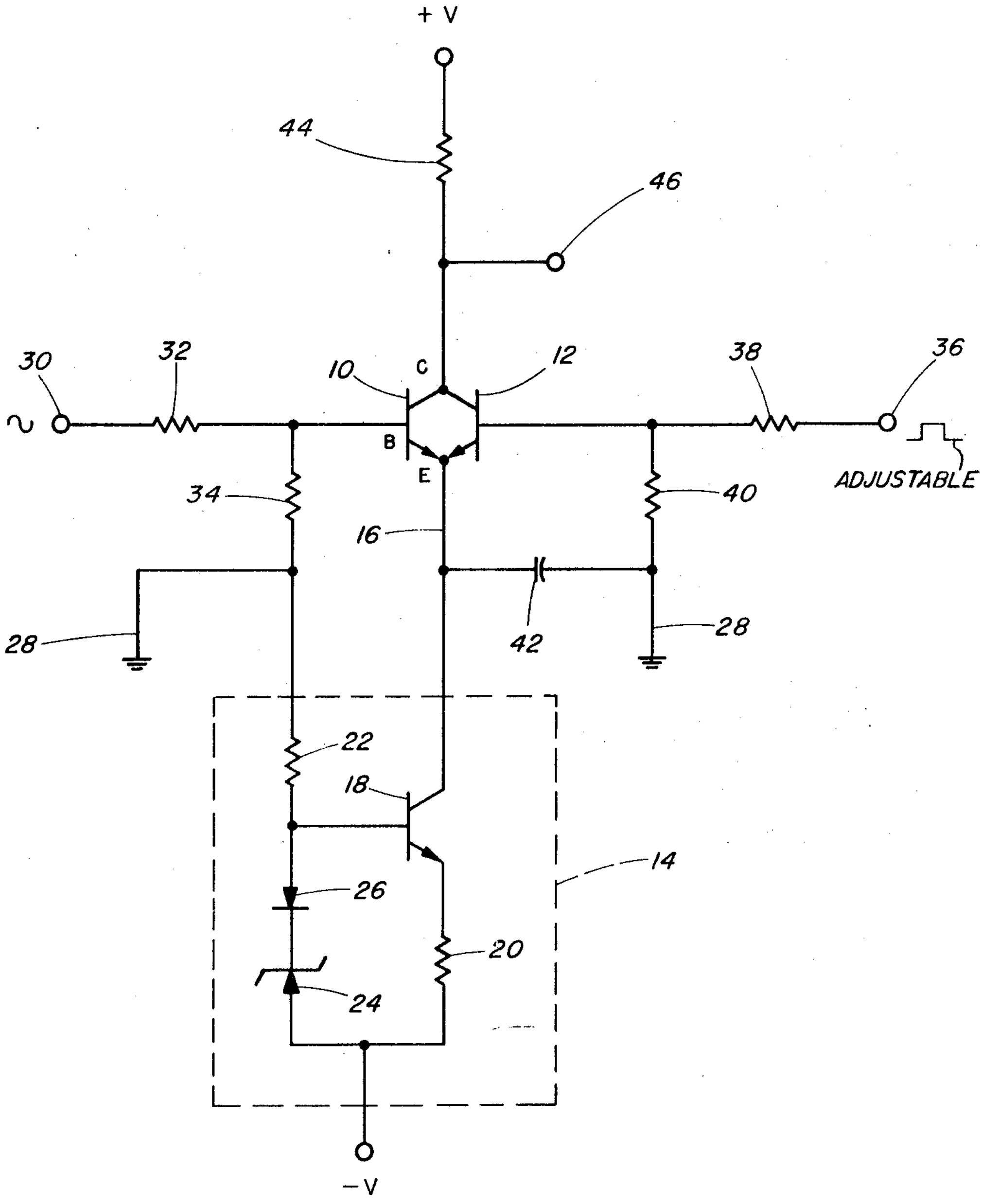
INVENTOR
Arthur D. Delagrange
BY J. O. Tresansky
ATTORNEY

EXPONENTIAL ATTENUATOR-AMPLIFIER CIRCUIT

BACKGROUND OF INVENTION

This invention generally relates to signal attenuation circuitry and in particular to circuit for attenuating a signal according to an exponential function of a control voltage.

Circuits capable of exponential attenuation of input signals are in demand in numerous environments where inputs are likely to vary over extremely broad dynamic ranges. Diodes have previously been used as logarithmic attenuators, although the inherent characteristics of diodes require that control voltages be reduced to a fraction of a volt. Since input signal voltages must be at least an order of magnitude smaller than control voltages to prevent unreasonable amounts of distortion, diode attenuators normally produce outputs of very low levels thereby requiring at least one stage of amplification to increase the output voltage level to a useful magnitude. In addition, diode attenuators have a variety of undesirable characteristics such as a strong temperature dependence causing attenuation to change considerably with varying temperatures. Furthermore, diode circuits often have low signal, high impedance points which are prone to hum and noise pickup which tend to limit their use to virtually noise-free environments or require extensive shielding of their components.

SUMMARY OF THE INVENTION

Accordingly, one object of this invention is to provide an exponential attenuator circuit for attenuating inputs which vary over broad dynamic ranges.

Another object of the instant invention is to provide an improved attenuator circuit having inherent amplification of its output.

Yet another object of the present invention is to provide an improved attenuator circuit having an output independent of ambient temperature variations.

A further object of this invention is to provide an improved attenuator circuit substantially immune to hum and noise pickup.

Briefly, these and other objects are achieved by providing a back-to-back coupled transistor pair having an input signal applied to one transistor and a control voltage applied to the other and utilizing the logarithmic current-voltage characteristics of the base-emitter diode of the input transistor. A temperature independent current source is coupled to the transistor pair to provide attenuation independent of ambient temperature variations.

A more complete appreciation of this invention and many of the attendant advantages thereof will be readily appreciated as the same becomes better understood by reference to the following detailed description when considered in connection with the accompanying drawing wherein the sole FIGURE is a schematic diagram of the attenuator circuit of the instant invention.

DESCRIPTION OF THE PREFERRED EMBODIMENT

As shown in the sole FIGURE, the attenuator circuit of this invention includes a pair of NPN-transistors 10 and 12 in a modified common emitter configuration with their respective collectors and emitters coupled directly together. This symmetrical interconnection of transistors 10 and 12 causes any temperature drift in one transistor to be automatically balanced by the temperature drift in the other thereby effecting an output signal of the transistor pair independent of temperature.

The total current through transistor pair 10, 12 is limited by a current source circuit 14 coupled to the joined emitters of the transistors through a conductor 16. Current source 14 includes an NPN-transistor 18 having a biasing resistor 20 connected between its emitter and the negative terminal of a unidirectional potential energy source, such as a battery, −V and a second biasing resistor 22 coupled between the base electrode and a common potential source or ground 28. A Zener diode 24 and a diode 26 are connected between the base of transistor 18 and −V to fix the operating point of transistor 18 in the conventional manner by fixing the potential at the base of the transistor, and to provide temperature stabilization thereby permitting current source 18 to generate a constant current independent of ambient temperature variations.

An input terminal 30 to which may be applied an AC signal to be attenuated is coupled to a voltage divider consisting of a pair of resistors 32 and 34. The juncture of the resistors is coupled to the base of transistor 10 while the other end of resistor 34 is connected to ground 28. The applied AC signal is attenuated by the voltage divider before being applied to the base of transistor 10.

Similarly, an input terminal 36 is coupled to a voltage divider consisting of resistors 38 and 40. Resistor 38 is coupled between terminal 36 and the base of transistor 12 while resistor 40 is coupled between the base of transistor 12 and ground 28. Any suitable source of adjustable DC voltage may be applied to terminal 36 for controlling the amount of attenuation which the overall circuit is to provide by controlling the fraction of the fixed total bias current that flows through each of transistors 10 and 12.

A capacitor 42 is coupled between ground 28 and the commonly connected emitters of transistors 10 and 12 for the purpose of providing a bypass path for AC signals present in the emitter circuit of transistor 10 so that they will not be balanced out as is the DC control voltage. A common load impedance, such as resistor 44, is coupled between the joined collectors of transistors 10 and 12 and a positive terminal of a unidirectional potential source, +V. The output of the circuit is taken from a terminal 46 connected between load resistor 44 and the joined collectors of transistors 10 and 12.

In operation, the AC signal to be attenuated is applied at input terminal 30 while an adjustable DC control voltage is applied to terminal 36. The input signal is initially attenuated by the voltage divider consisting of resistors 32 and 34 and is then applied to the base of transistor 10. Transistor 10 acts as an amplifier for the AC input signal with its gain directly proportional to its bias current, but logarithmically proportional to its bias voltage, as is well known. The bias voltage of transistor 10 is set by transistor 12 due to the interconnected collectors and emitters of the two transistors, and is directly proportional to the applied control voltage. Thus, the output of the transistor pair is a replica of the input AC signal amplified by an amount proportional to the exponential of the bias or control voltage. This is, of course, equivalent to attenuation in decibels of the output by an amount proportional to the control voltage.

Current source 14 fixes the sum of all currents through transistors 10 and 12 thereby rendering circuit current independent of any changes in the control voltage. Transistors 10 and 12 both have resistor 44 as their load resistor, so that the DC output voltage is independent of the control voltage. Thus, the circuit produces an adjustable exponential attenuation of an input signal which is virtually independent of temperature fluctuations. As an exponential attenuator, the circuit provides attenuation over broad dynamic ranges of input signal variation.

Numerous modifications and variations of this circuit may be made without changing the basic principles of the invention. For example, control voltage input terminal 36 along with voltage dividing resistor 38 may be coupled directly to the base of transistor 10. This configuration may provide greater flexibility for some applications, although it will create some signal feed-through from one input to the other thereby causing the control voltage and the AC input voltage to be slightly dependent upon one another. An inductor or a tuned circuit may be substituted for load resistor 44 to achieve higher gain at a fixed high frequency. Current source 14 may be replaced by a resistor, as a crude approximation to a current source, or by a constant current diode at a slight degradation in performance. Although the circuit has been disclosed using NPN transistors, it is obvious that the transistors may be of the PNP type, in which case all reference potentials must be reversed from the polarities illustrated and described.

Obviously, numerous additional modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. An exponential attenuator-amplifier circuit comprising:

a first transistor having its base coupleable to an alternating current input voltage;

a second transistor having its emitter connected to the emitter of said first transistor, having its collector connected to the collector of said first transistor, and having its base coupleable to an adjustable direct current control voltage, the gain of said first transistor logarithmically proportional to said adjustable direct current control voltage;

current source means coupleable to the commonly connected emitters of said first and said second transistors for fixing the total current flowing through said first and said second transistors;

means for providing a bypass path to a source of reference potential for alternating current signals present at said commonly connected emitters; and output means connected to the commonly connected collectors of said first and said second transistors providing a direct current output voltage that is independent of said adjustable direct current control voltage and an exponentially attenuated alternating current output voltage in response to said alternating current input voltage and said adjustable direct current voltage.

2. An exponential attenuator-amplifier circuit as in claim 1 wherein:

said current source means includes a transistor having a diode and a zener diode coupled to its base electrode.

3. An exponential amplifier circuit as in claim 1, wherein said means for providing a bypass path comprises a capacitor connected at one end to said commonly connected emitters and connectable at the other end to said source of reference potential.

* * * * *